United States Patent [19]

Jacopich et al.

[11] Patent Number: 4,857,761
[45] Date of Patent: Aug. 15, 1989

[54] CIRCUIT FOR MONITORING A PLURALITY OF ANALOG QUANTITIES

[75] Inventors: Werner Jacopich; Kurt Winter; Siegfried Mayr, all of Vienna, Austria

[73] Assignee: Siemens Aktiengesellschaft, Berlin and Munich, Fed. Rep. of Germany

[21] Appl. No.: 176,780

[22] Filed: Apr. 1, 1988

[30] Foreign Application Priority Data

Apr. 4, 1987 [AT] Austria ................................. 861/87

[51] Int. Cl.⁴ .............................................. H03K 5/24
[52] U.S. Cl. ................................. 307/350; 307/355; 307/357; 307/362; 307/364
[58] Field of Search ............... 307/355, 356, 357, 362, 307/364; 328/115, 116, 146, 147

[56] References Cited

U.S. PATENT DOCUMENTS

| | | | |
|---|---|---|---|
| 3,593,285 | 7/1971 | Gillmann | 307/357 |
| 4,039,859 | 8/1977 | Horninger | 307/355 |
| 4,341,961 | 7/1982 | Komoriya | |
| 4,583,010 | 4/1986 | Brentnall | 307/355 |

FOREIGN PATENT DOCUMENTS

| | | |
|---|---|---|
| 0009649 | 10/1981 | European Pat. Off. |
| 2935483 | 3/1981 | Fed. Rep. of Germany |
| 3305626 | 3/1984 | Fed. Rep. of Germany |
| 1123566 | 9/1956 | France |

OTHER PUBLICATIONS

Article entitled: "Der Extremsucher, cin kontaktloses Extremwert-und Extremort-Auswahlgerate", in Regelungstedinik, Heft 10, Oct. 1960, pp. 359-363.

Primary Examiner—John Zazworsky
Attorney, Agent, or Firm—Hill, Van Santen, Steadman & Simpson

[57] ABSTRACT

A circuit for monitoring a plurality of analog quantities which provides signals for exceeding of threshold values and utilizes a differential amplifier. One input of the differential amplifier is connected to a reference voltage source and the other input is connected to a reference resistor. The quantities to be monitored are represented by voltages or by impressed currents that are supplied to the input of the differential amplifier which is connected to the reference resistor and supplied thereto via decoupling diodes and coupling resistors. A plurality of coupling resistors are connected with reference resistor to form a single voltage divider whose taps receive the representative voltages or, impressed currents and are supplied in graduated steps according to values of the allocated threshold values.

5 Claims, 1 Drawing Sheet

CIRCUIT FOR MONITORING A PLURALITY OF ANALOG QUANTITIES

BACKGROUND OF THE INVENTION

The present invention is directed to a circuit for monitoring a plurality of analog quantities and for signaling the exceeding of these quantities of threshold values utilizing a differential amplifier. A reference voltage source is connected between a grounded potential and one input of the differential amplifier and a reference resistor is connected between the grounded potential and the other input of the differential amplifier. Quantities to be monitored are represented by voltages or by impressed currents that are supplied to the input of the differential amplifier which is connected to the reference resistor. The representative voltages or impressed currents are supplied via decoupling diodes and coupling resistors.

The principle regarding the monitoring of threshold values by prior art differential amplifiers is set forth below with reference to FIG. 1 of the drawings.

The quantity to be monitored is represented by a voltage of a voltage source U, this voltage source U being connected via a coupling resistor R and, for proper operating conditions, via a diode D to one input of a differential amplifier V that is additionally connected to a reference resistor RO. A reference voltage source UO is connected to the other input of the differential amplifier V. This reference voltage source UO, as well as the reference resistor RO, has its second terminal connected to the grounded potential. Together with the reference resistor RO, the coupling reistor R forms a voltage divider that is fed by a voltage U' that is equal to the voltage U less the voltage drop across the diode D, this voltage U representing the quantity to be monitored. As soon as this voltage U exceeds the prescribed threshold value, the voltage drop across the reference resistor RO also rises above the prescribed value of the reference voltge UO. As a result, the differential amplifier V signals the exceeding of the threshold value in a well known manner.

In an apparatus wherein a plurality of parameters and operating values that are usually represented by analog voltages or by impressed currents are to be monitord, a separate monitoring means is usually provided for each of these quantities. This, however, proves to be extremely involved. This problem has special significance in apparatus that function with a plurality of supply voltages, indirect voltages, output voltages, analog input and output signals, as well as incoming and outgoing binary messages that are to be monitored for exceeding threshold values or levels.

A prior art circuit is shown in FIG. 2 which utilizes a single differential amplifier for monitoring a plurality of such quantities.

Two voltages (or an arbitrary number of voltages) such as voltage sources U1, U2 are to be monitored for exceeding a threshold value and are connected to voltage dividers R1, R0 and respectively R2, R'0 whose center taps are connected to an input of the differential amplifier V via decoupling diodes D1, D2 whereby the resistors R0, and R'0 are reference resistors. Although this circuit is adequate with a single differential amplifier V and with a single reference voltage source U0, two resistors for each quantity to be monitored are still required.

SUMMARY OF THE INVENTION

An object of the present invention is to reduce circuit complexity and the present invention achieves this in that a plurality of coupling resistors are connected in series with the reference resistor to form a single voltage divider into whose taps the voltages or impressed currents to be monitored are supplied. The voltage drops (for example, the representative voltage less the voltage drop across the connected diode) or impressed currents between the allocated taps and the grounded potential have values relative to the reference voltage in the same proportion as the values of resistance measured from the allocated taps to the terminal of the grounded potential have values relative to the value of resistance of the reference resistor.

BRIEF DESCRIPTION OF THE DRAWINGS

The features of the present invention which are believed to be novel, are set forth with particularity in the appended claims. The invention, together with further objects and advantages, may best be understood by reference to the followng description taken in conjunction with the accompanying drawings, in the several Figures in which like reference numerals identify like elements, and in which:

DESCRIPTION OF THE PREFERRED EMBODIMENT

Figure 1:
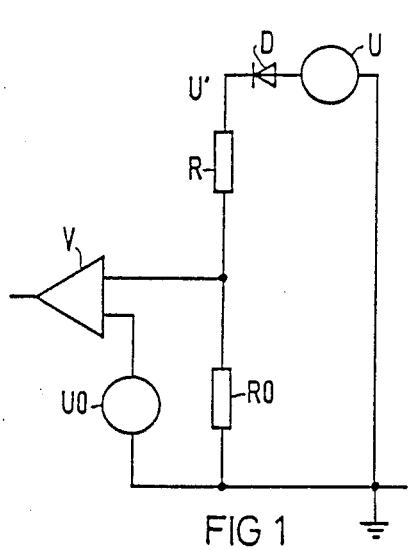
FIG. 1 is a circuit schematic of a prior art monitoring circuit.
Figure 2:
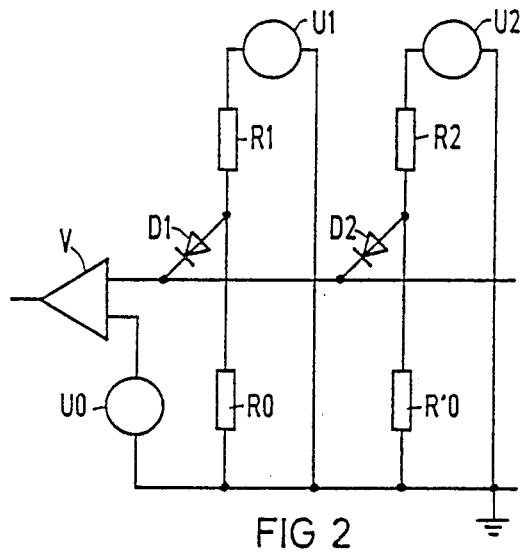
FIG. 2 is a circuit schematic of a prior art circuit for monitoring more than one value.
Figure 3:
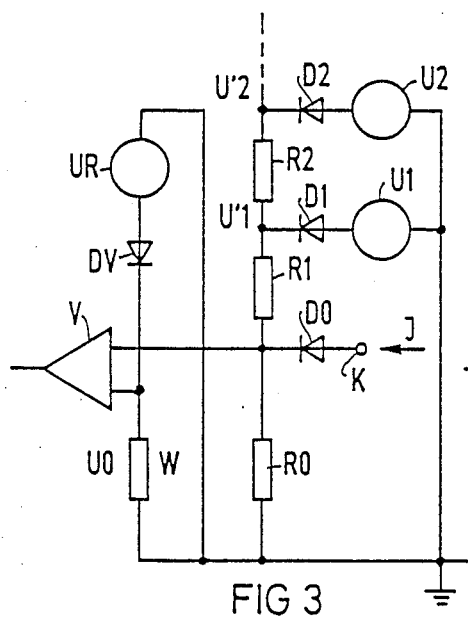
FIG. 3 is a circuit schematic of a monitoring circuit according to the present invention.

The circuit shown in FIG. 3 serves the purpose of monitoring two representative voltages U1, U2 as well as an impressed current J of a high-impedance current source. This current source (not shown in detal) is connected to terminal K. The voltage sources U1, U2 and the impressed current J are connected via the allocated decoupling diodes D0, D1, D2 to the tap of a single voltage divider composed of the reference reisistor R0 and the coupling resistor R1, R2. The voltages at the taps are rferenced U'1 and U'2 and are equal to the voltages U1, U2, less the voltage drops across the decoupling diodes D1, D2. These voltages U1, U2, represent the quantities to be monitored. The remaining function of the circuit is the same as that of the circuits described in FIGS. 1 and 2. A practically arbitrary number of quantities can be monitored by means of a voltage divider having even more coupling resistors.

FIG. 3 shows a specific circuit for generating the reference voltage U0 that is composed in detail of a reference voltage source UR that is connected to one input of the differential amplifier V via a series diode DV and provides the reference voltage U0 across a resistor W. The terminal to ground of the reference voltage source UR is connected to the resistor W.

Figure 4:
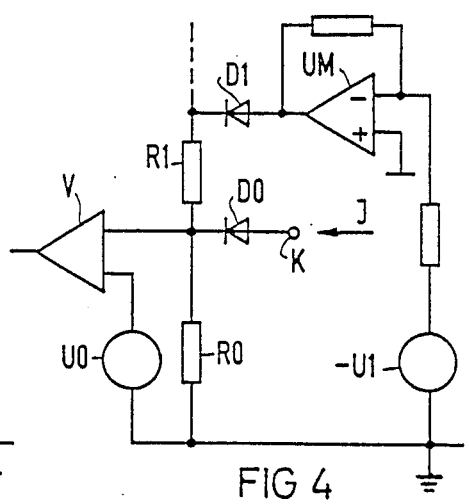
FIG. 4 is a circuit schematic of an alternative embodiment of the present invention.

When the voltage representing the quantity to be monitored is negative compared to the grounded potential and in order to distinguish it from the other representative voltages, then, as shown in FIG. 4, the corresponding voltage source −U1 is connected via an inverting element UM and the decoupling diode D1 is connected to the allocated tap of the voltage divider R0, R1 ... The reversing element UM can be an operational amplifier having feedback and driven via its inverting input.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A circuit for monitoring a plurality of analog quantities for exceeding threshold values with the use of a differential amplifier signaling the exceeding of the threshold values, the circuit has a reference voltage source connected between a grounded potential and a first input of the differential amplifier and a reference resistor connected between the grounded potential and a second input of the differential amplifier, whereby the quantities to be monitored are represented by representative voltages and by impressed currents that are supplied to the second input of the differential amplifier via coupling diodes and coupling resistors, comprising a plurality of coupling resistors connected in series to the reference resistor to form a single voltage divider whose taps receive the representative voltages and impressed currents; and voltage drops from the taps to the grounded potential produced by the representative voltages and the impressed currents having values relative to the reference voltage source in the same proportion as the values of resistance measured from the taps to a terminal of the grounded potential have relative to the value of resistance of the reference resistor.

2. A circuit for monitoring a plurality of analog quantities and utilizing a differential amplifier to provide a signal indicative of at least one of said analog quantities exceeding an associated threshold value of a plurality of threshold values, said circuit having a reference voltage source connected between a grounded potential and a first input of the differential amplifier and a reference resistor connected between the grounded potential and a second input of the differential amplifier, whereby the quantities to be monitored are represented at least by representation signals connected to the second input of the differential amplifier connected to the reference resistor via a diode connected to at least one coupling resistor, comprising:

a plurality of coupling resistors connected in series to the reference resistor to form a single voltage divider, taps of said voltage divider receiving said representation signals;

voltage drops from the taps to the grounded potential produced by the representation signals having values relative to the reference voltage source in the same proportion as the values of resistance measured from the taps to a terminal to the ground potential have relative to the value of resistance of the reference resistor.

3. The circuit according to claim 2, wherein said representation signals are representative voltages.

4. The circuit according to claim 2, wherein said representation signals are impressed currents.

5. A circuit for monitoring a plurality of analog quantities regarding the transgression of allocated limiting values with the use of a differential amplifier signalizing limiting value transgressions, whereby a reference voltage source is connected between a ground potential and a first input of the differential amplifier, and a reference resistance is connected between the ground potential and a second input of the differential amplifier, whereby the quantities to be monitored are represented by representative voltages or by load independent currents that are fed via decoupling diodes and coupling resistances into the second input of the differential amplifier, this second input being connected to the reference resistance, comprising a plurality of coupling resistances and the reference resistance connected to form one single voltage divider, in whose taps the representative voltages or the load independent currents are fed such that each of the representative voltages, decreased by a voltage drop across an associated diode of said decoupling diodes, and each load independent current respectively causes a partial current in the reference resistance so that the sum of all partial currents in the reference resistance in the nominal condition of all quantities to be monitored causes a voltage drop across the reference resistance that is equal to the reference voltage.

* * * * *